(12) United States Patent
Tokumitsu et al.

(10) Patent No.: US 11,881,514 B2
(45) Date of Patent: Jan. 23, 2024

(54) SEMICONDUCTOR DEVICE AND TERMINATION STRUCTURE

(71) Applicant: Hitachi Power Semiconductor Device, Ltd., Hitachi (JP)

(72) Inventors: Shigeo Tokumitsu, Hitachi (JP); Masaki Shiraishi, Hitachi (JP); Yutaka Kato, Hitachi (JP); Tetsuo Oda, Hitachi (JP)

(73) Assignee: HITACHI POWER SEMICONDUCTOR DEVICE, LTD., Ibaraki (JP)

( * ) Notice: Subject to any disclaimer, the term of this patent is extended or adjusted under 35 U.S.C. 154(b) by 0 days.

(21) Appl. No.: 17/532,741

(22) Filed: Nov. 22, 2021

(65) Prior Publication Data

US 2022/0199786 A1 Jun. 23, 2022

(30) Foreign Application Priority Data

Dec. 23, 2020 (JP) ................. 2020-213187

(51) Int. Cl.
*H01L 29/40* (2006.01)
*H01L 21/02* (2006.01)
(Continued)

(52) U.S. Cl.
CPC ........ *H01L 29/402* (2013.01); *H01L 21/0214* (2013.01); *H01L 21/02118* (2013.01); *H01L 29/0619* (2013.01); *H01L 29/12* (2013.01)

(58) Field of Classification Search
CPC ............. H01L 29/402; H01L 21/02118; H01L 21/0214; H01L 29/0619; H01L 29/12;
(Continued)

(56) References Cited

U.S. PATENT DOCUMENTS 10,079,298 B2 9/2018 Kinoshita et al.
2013/0119373 A1 5/2013 Yamazaki
(Continued)

FOREIGN PATENT DOCUMENTS

JP 2001-345319 A 12/2001
JP 2001-352056 A 12/2001
(Continued)

OTHER PUBLICATIONS

Office Action, dated Jul. 13, 2022, for Taiwanese Application No. 110145885.
(Continued)

*Primary Examiner* — Shahed Ahmed
(74) *Attorney, Agent, or Firm* — Baker Botts L.L.P.

(57) ABSTRACT

Provided is a highly reliable semiconductor device in which an influence on device characteristics can be reduced while improving a high temperature and high humidity bias resistance of a termination structure (termination region) of a chip by a relatively simple method. The semiconductor device includes an active region disposed on a main surface of a semiconductor substrate, and a termination region disposed on the main surface so as to surround the active region. The termination region includes an interlayer insulating film formed on the main surface of the semiconductor substrate, and an organic protective film formed so as to cover the interlayer insulating film. An insulating film having a thickness of 100 nm or less and containing nitrogen is provided between the interlayer insulating film and the organic protective film.

13 Claims, 7 Drawing Sheets

(51) Int. Cl.
*H01L 29/06* (2006.01)
*H01L 29/12* (2006.01)

(58) Field of Classification Search
CPC ............... H01L 29/7811; H01L 29/404; H01L 29/7395; H01L 29/7393; H01L 29/408; H01L 29/51; H01L 29/518; H01L 29/66325–66348; H01L 29/083–0839; H01L 21/76801–76837; H01L 23/5329–53295; H01L 29/42312–42392; H01L 29/49–4991
See application file for complete search history.

(56) References Cited

U.S. PATENT DOCUMENTS

| | | |
|---|---|---|
| 2014/0197476 A1 | 7/2014 | Shimatou |
| 2015/0214164 A1 | 7/2015 | Matocha et al. |
| 2017/0077218 A1* | 3/2017 | Nishikawa .......... H01L 29/8611 |
| 2017/0263756 A1* | 9/2017 | Blank ................... H01L 29/404 |
| 2019/0080976 A1 | 3/2019 | Kudou et al. |
| 2020/0243680 A1 | 7/2020 | Morimoto |
| 2021/0118761 A1 | 4/2021 | Ebihara |

FOREIGN PATENT DOCUMENTS

| | | |
|---|---|---|
| JP | 2017-017145 A | 1/2017 |
| JP | 2017-092360 A | 5/2017 |
| JP | 2019-175937 A | 10/2019 |
| WO | 2020/035938 A1 | 2/2020 |

OTHER PUBLICATIONS

Extended European Search Report, dated Apr. 28, 2022, for European Application No. 21211679.2

Notice of Reasons for Refusal dated Nov. 21, 2023 for Japanese Application No. 2020-213187.

\* cited by examiner

SEMICONDUCTOR DEVICE AND TERMINATION STRUCTURE

CLAIM OF PRIORITY

The present application claims priority from Japanese Patent application serial no. 2020-213187, filed on Dec. 23, 2020, the content of which is hereby incorporated by reference into this application.

BACKGROUND OF THE INVENTION

1. Field of the Invention

The present invention relates to a structure of a semiconductor device, and particularly, to a technique effectively applied to a termination structure of a power semiconductor chip.

2. Description of the Related Art

One of causes of breakdown voltage deterioration of a power semiconductor chip is electric field concentration in a chip termination portion. When a junction is formed on a surface of the power semiconductor chip, a depletion layer spreads in a fan shape at the termination portion when a reverse bias is applied. Electric force lines of electric charges in a region in the fan shape gather at the chip termination portion, and the electric field concentration occurs. As a result, avalanche breakdown (dielectric breakdown) occurs at a voltage considerably lower than a theoretical breakdown voltage.

In order to relax the electric field concentration at the chip termination portion, it is necessary to disperse destinations of the electric force lines from the electric charges in a region of the depletion layer spreading in the fan shape when the reverse bias is applied from the chip termination portion to the entire termination structure (hereinafter, also referred to as termination region). As a method thereof, various structures are proposed, such as a junction termination extension (JTE) structure in which a low concentration region having the same polarity as a surface side of the junction is formed on a semiconductor surface adjacent to a junction termination, and a guard ring structure in which a structure having the same polarity as the surface side of the junction is formed in a plurality of ring shapes along the junction termination.

As a related art of the present technical field, for example, a technique as disclosed in Patent Literature 1 (JP-A-2001-345319) is given. Patent Literature 1 discloses that, in order to prevent deterioration of device characteristics such as a decrease in breakdown voltage and an increase in leakage current due to moisture, a plasma TEOS oxide film is formed on a semiconductor substrate including an interlayer insulating film, a source electrode, and a drain electrode, the plasma TEOS oxide film is etched back so as to remain in a spacer shape in a stepped portion under the plasma TEOS oxide film, and a plasma nitride film is formed, as a passivation film, on the plasma TEOS oxide film. Further, paragraph [0016] of Patent Literature 1 discloses that a plasma nitride film 13 is formed to a thickness of 1 µm.

In addition, Patent Literature 2 (JP-A-2001-352056) discloses that, in order to prevent a reduction in a service life of a semiconductor device due to corrosion of an aluminum wiring, an increase in leakage current, or the like caused by moisture in a mold resin, a two-layer film having different film qualities of a silicon nitride film on a lower layer side having a relatively high refractive index and a silicon nitride film on an upper layer side having a relatively low refractive index is formed by a plasma CVD method. Further, paragraph [0013] of Patent Literature 2 discloses that a first silicon nitride film 15 is formed to a thickness of 1 µm, and paragraph [0015] discloses that a second silicon nitride film 16 is formed to a thickness of 1 µm.

In addition, Patent Literature 3 (JP-A-2017-92360) discloses that a laminated structure of an oxide film 42, a resistive silicon nitride film 44 having a refractive index of 2.9 or more and 3.3 or less, an interlayer insulating film 46, an insulating silicon nitride film 47 having a refractive index of 1.8 or more and 2.2 or less, and a polyimide film 48 is formed in an end region 120 in order from the lower layer, and thereby crack resistance is improved (FIG. 4, paragraphs [0066] to [0068], and the like of Patent Literature 3). Further, paragraph [0039] of Patent Literature 3 discloses that the resistive silicon nitride film 44 has a thickness of 0.5 µm or more and 0.8 µm or less, and paragraph [0066] discloses that the insulating silicon nitride film 47 has a thickness of about 1.2 µm.

As described above, in order to improve a reliability and further increase a breakdown voltage of a power semiconductor chip, it is important to improve an insulation resistance of a termination structure (termination region) of the power semiconductor chip. For this reason, a reliability test is carried out as one of the reliability tests for the power semiconductor chip, and an improvement is required on a high temperature and high humidity bias resistance for evaluating a durability when used in a high temperature and high humidity atmosphere.

In Patent Literature 1, the plasma nitride film having a thickness of 1 µm is formed as a passivation film, thereby preventing penetration of moisture and preventing deterioration of device characteristics such as a decrease in breakdown voltage and an increase in leakage current. However, the plasma nitride film generally has a high internal stress, and therefore, the device characteristics may be influenced, for example, a mobility of electrons may vary.

In addition, in Patent Literature 2, the two-layer silicon nitride film having different film qualities is formed, and a total thickness of the silicon nitride film becomes 2 µm, and therefore, the internal stress of the film becomes a problem.

In addition, in Patent Literature 3, the resistive silicon nitride film and the insulating silicon nitride film having different refractive indexes are formed, and the total thickness of the silicon nitride films is increased from 1.7 µm to 2.0 µm, which may influence the device characteristics, as in Patent Literature 2.

SUMMARY OF THE INVENTION

Therefore, an object of the invention is to provide a highly reliable semiconductor device in which an influence on device characteristics can be reduced while improving the high temperature and high humidity bias resistance of a termination structure (termination region) of a chip by a relatively simple method.

In order to solve to above problem, the invention includes an active region disposed on a main surface of a semiconductor substrate, and a termination region disposed on the main surface so as to surround the active region. The termination region includes an interlayer insulating film formed on the main surface of the semiconductor substrate, and an organic protective film formed so as to cover the interlayer insulating film. An insulating film having a thickness of 100 nm or less and containing nitrogen is provided between the interlayer insulating film and the organic protective film.

According to the invention, a highly reliable semiconductor device in which the influence on the device characteristics can be reduced while improving the high temperature and high humidity bias resistance of a termination structure (termination region) of a chip by a relatively simple method can be provided.

Problems, configurations, and effects other than those described above will become clear according to the descriptions in the following embodiments.

DESCRIPTION OF THE PREFERRED EMBODIMENTS

Hereinafter, embodiments of the invention will be described with reference to the drawings. In addition, in the drawings, the same configurations are denoted by the same reference numerals, and the detailed description of overlapping portions is omitted.

First Embodiment

Figure 1:
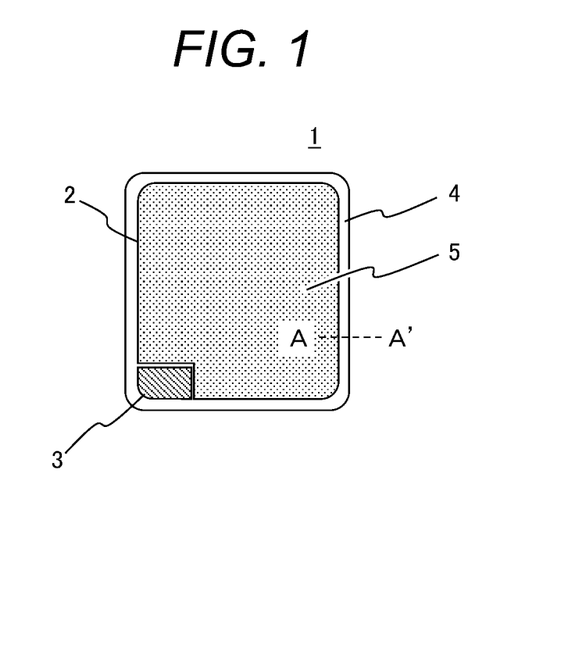
FIG. 1 is a plan view showing an appearance of an IGBT chip according to a first embodiment of the invention.
Figure 2:
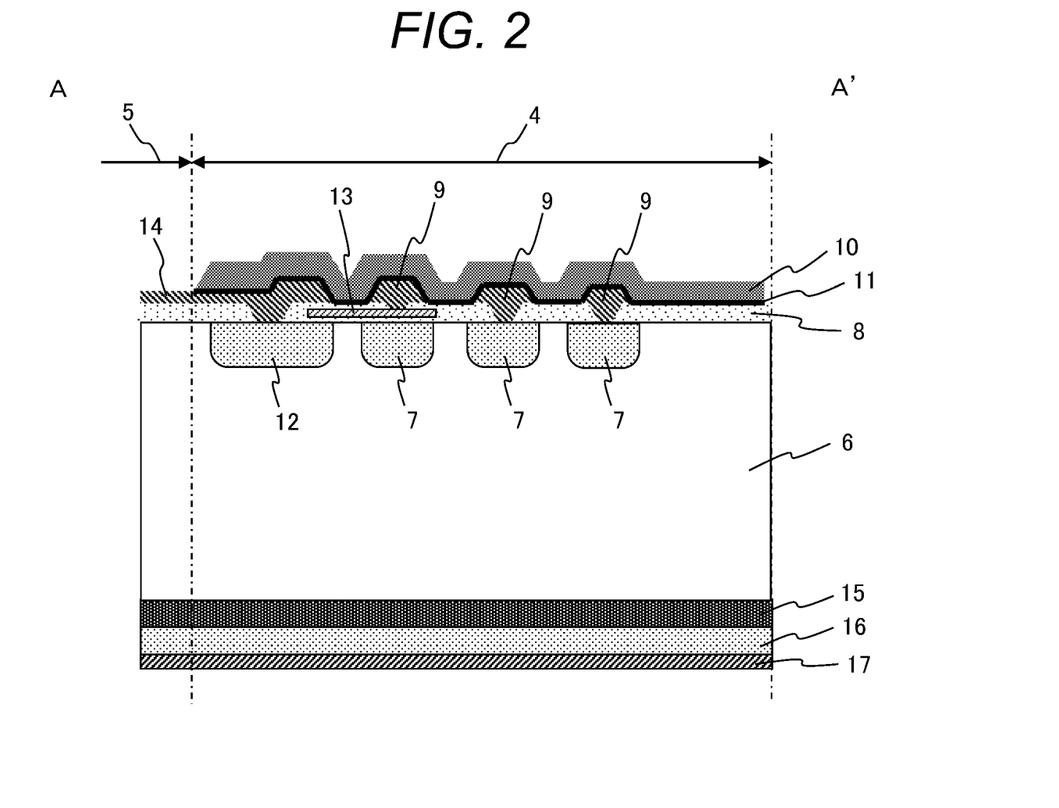
FIG. 2 is a cross-sectional view taken along a line A-A' of FIG. 1.
Figure 3A:
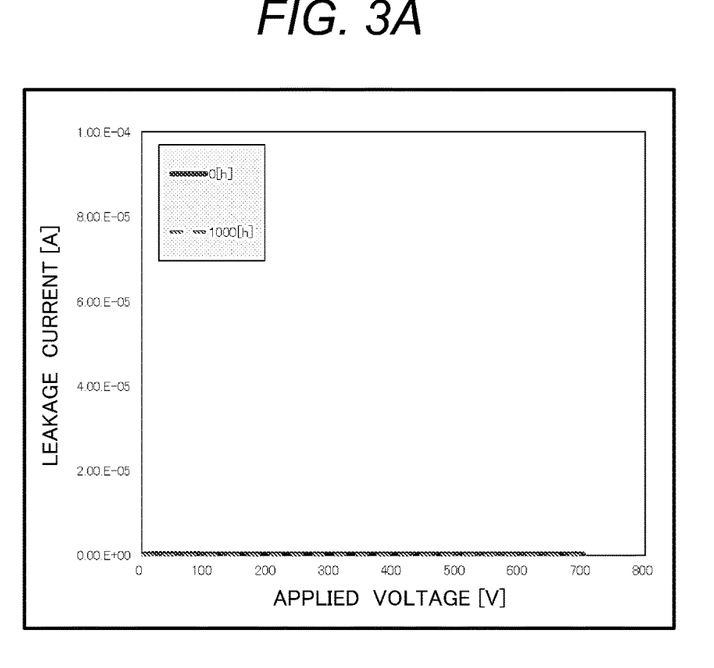
FIG. 3A is a diagram showing results of a high temperature and high humidity bias test of the IGBT chip according to the first embodiment of the invention.
Figure 3B:
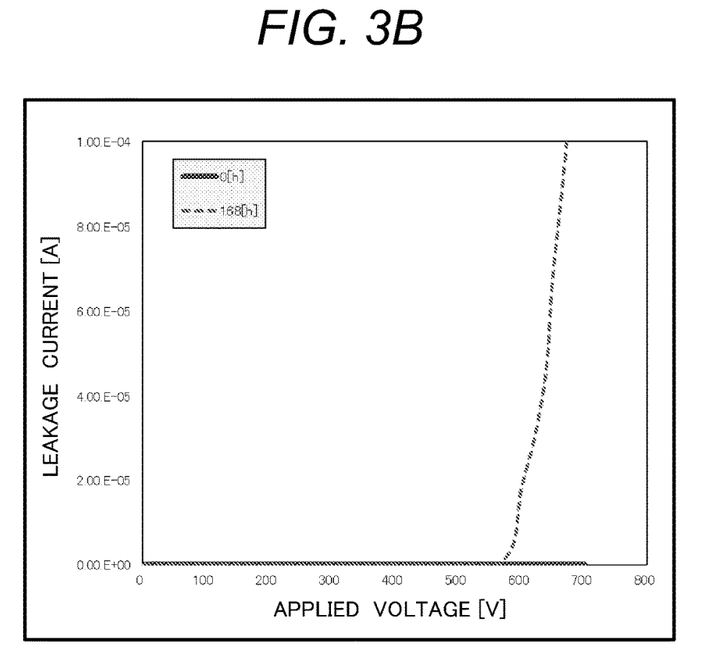
FIG. 3B is a diagram showing results of a high temperature and high humidity bias test of an IGBT chip in the related art.

A semiconductor device and a method of manufacturing the same according to the first embodiment of the invention will be described with reference to FIGS. 1 to 3B and FIGS. 7A to 7E. FIG. 1 is a plan view showing an appearance of the semiconductor device of the present embodiment, and shows an insulated gate bipolar transistor (IGBT) chip as an example. FIG. 2 is a cross-sectional view taken along a line A-A' of FIG. 1. FIG. 3A is a voltage-current characteristic diagram showing an example of effects of the invention, and FIG. 3B is a voltage-current characteristic diagram of a semiconductor device in the related art shown as a comparative example. FIGS. 7A to 7E are cross-sectional views showing main manufacturing processes in the method of manufacturing the semiconductor device of the present embodiment.

In addition, the IGBT chip will be described below as an example of the semiconductor device, but a subject of the invention is not limited thereto, and the invention may also be applied to a diode, a thyristor, a power MOSFET, a double-diffused MOSFET (DMOSFET), and the like.

As shown in FIG. 1, an IGBT chip 1 of the present embodiment includes an active region 5 disposed on a main surface of a semiconductor substrate, and a termination region 4 disposed so as to surround a periphery of the active region 5. An emitter electrode 2 and a gate electrode 3 are formed on the active region 5. The termination region 4 is a termination structure that relaxes electric field concentration in a chip termination portion of the IGBT chip 1, that is, an electric field relaxing region.

For example, as shown in FIG. 2, the termination region 4 includes a plurality of guard rings 7 formed in a main surface of an n-type semiconductor substrate 6, an interlayer insulating film 8 formed on the main surface of the semiconductor substrate 6, field plate electrodes 9 formed on the interlayer insulating film 8 and connected to the guard rings 7 by penetrating through openings formed in the interlayer insulating film 8, and an organic protective film 10 formed so as to cover the interlayer insulating film 8 and the field plate electrodes 9.

In addition, an insulating film 11 having a thickness of 100 nm or less (preferably 50 nm or less) and containing nitrogen is provided between the interlayer insulating film 8 and the organic protective film 10. A lower limit of the thickness of the insulating film 11 containing nitrogen is 10 nm or more (preferably 20 nm or more). The meaning of an upper limit and the lower limit of the thickness will be described later.

Here, a Si substrate is assumed as the n-type semiconductor substrate 6, but a SiC substrate, a GaN substrate, or the like may be used. The guard ring 7 is a p-type diffusion layer formed on the surface of the semiconductor substrate 6 by ion implantation. The interlayer insulating film 8 is formed of a gate oxide film formed by pyrogenic oxidation or the like, which will be described later, and an interlayer film such as a tetra ethoxy silane (TEOS) film or a boron-phospho silicate glass (BPSG) film, and is a silicon oxide film ($SiO_2$).

The field plate electrode 9 is an electrode film formed of a laminated film of, for example, Ti/TiN/Al, MoSi/Al, or the like, and is formed in the same layer as the emitter electrode 2 and a pad electrode 14 in the active region 5. As the organic protective film 10, for example, a polyimide film is used.

As the insulating film 11 containing nitrogen, for example, a silicon nitride film ($Si_3N_4$), a silicon oxynitride film (SiON), or the like is used.

An n-type diffusion layer 15, a p-type diffusion layer 16, and a collector electrode 17 are formed on a back surface of the semiconductor substrate 6 in order from the substrate side.

In the active region 5, when a voltage is applied between the gate electrode 3 and the emitter electrode 2, an n-channel inversion layer is formed immediately below the gate oxide film, and the MOSFET portion is turned on. Further, when a voltage is applied between the collector electrode 17 and the emitter electrode 2, hole avalanche occurs from the collector electrode 17 toward the emitter electrode 2, a current flows between the collector electrode 17 and the emitter electrode 2, and the IGBT is turned on. When the voltage between the gate electrode 3 and the emitter electrode 2 is returned to 0 (zero), the inversion layer disappears, the n-channel of the MOSFET portion is cut off, and the IGBT is turned off.

The IGBT chip 1 according to the present embodiment is configured as described above, and in the termination region 4, in addition to the organic protective film 10, the insulating film 11 having a thickness of 10 nm or more (preferably 20 nm or more) and 100 nm or less (preferably 50 nm or less) and containing nitrogen is further provided between the interlayer insulating film 8 and the organic protective film 10, so that penetration of moisture from a surface side of the IGBT chip 1 can be more reliably prevented and a high temperature and high humidity bias resistance can be improved.

An insulating film containing nitrogen such as a silicon nitride film ($Si_3N_4$) and a silicon oxynitride film (SiON) generally has a dense structure, is excellent in moisture barrier property and insulating property, but has a high internal stress. Therefore, device characteristics of the IGBT chip 1 may be influenced, for example, a mobility of electrons may vary.

Therefore, in the present embodiment, the upper limit of the thickness of the insulating film 11 containing nitrogen is set to 100 nm or less (preferably 50 nm or less), so as to prevent an influence on the device characteristics of the IGBT chip 1. Meanwhile, the lower limit of the thickness is set to 10 nm or more (preferably 20 nm or more), so as to ensure the moisture barrier property and obtain a process margin (tolerance for ensuring a certain film quality) when the insulating film 11 containing nitrogen is formed by a plasma CVD method or a reactive sputtering method.

FIGS. 3A and 3B show results of a high temperature and high humidity bias test of the IGBT chip. FIG. 3A shows the results of the test on the IGBT chip according to the present embodiment, and FIG. 3B shows the results of the test on the IGBT chip in the related art.

Test conditions of the high temperature and high humidity bias test are a temperature of 85° C., a humidity of 85%, and Vcc=80 V. In addition, as a test sample, a polyimide film having a thickness of 10 μm is used as the organic protective film 10, and a silicon oxynitride film (SiON) having a thickness of 30 nm is used as the insulating film 11 containing nitrogen.

It can be seen that as shown in FIG. 3B, in the IGBT chip in the related art in which the insulating film 11 containing nitrogen is not provided between the interlayer insulating film and the organic protective film 10, voltage-current characteristics change at 168 hours (h), whereas as shown in FIG. 3A, in the IGBT chip according to the present embodiment, the voltage-current characteristics do not change even after 1000 hours (h) have passed, and a breakdown voltage is maintained.

The method of manufacturing the semiconductor device according to the present embodiment described above will be described with reference to FIGS. 7A to 7E. In addition, each of the drawings mainly shows a cross section of the manufacturing process of the termination region 4.

Figure 7A:
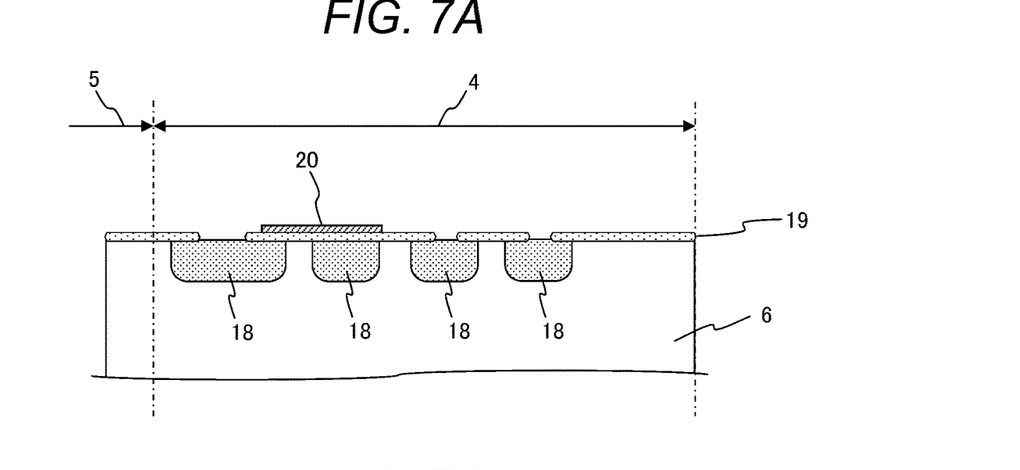
FIG. 7A is a cross-sectional view showing a manufacturing process of the IGBT chip according to the first embodiment of the invention.

First, as shown in FIG. 7A, a gate oxide film ($SiO_2$) 19 is formed on the main surface of the n-type semiconductor substrate 6 by dry oxidation using dry oxygen ($O_2$) or selective oxidation using wet oxidation (pyrogenic oxidation) using water vapor by combustion reaction of oxygen ($O_2$) and hydrogen gas ($H_2$). Thereafter, a polysilicon film (Poly-Si) 20 is formed on the gate oxide film 19 by a low-pressure CVD device or the like, and a gate electrode (reference numeral 13 in FIG. 2) is formed by photolithographic patterning and etching. Subsequently, a p-type impurity such as boron (B) is implanted into the main surface of the semiconductor substrate 6 by ion implantation to form p-type diffusion layers 18. These p-type diffusion layers 18 function as guard rings (reference numeral 7 in FIG. 2).

Figure 7B:
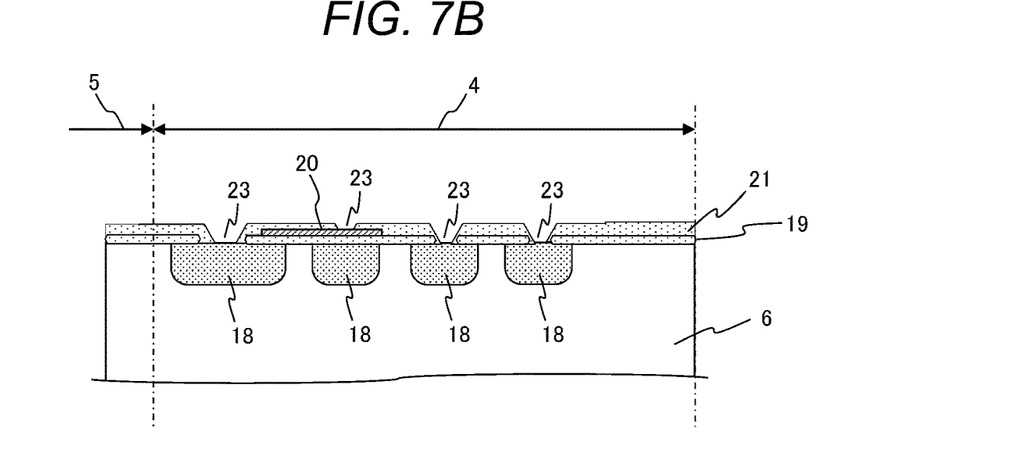
FIG. 7B is a cross-sectional view showing a manufacturing process following FIG. 7A.

Next, as shown in FIG. 7B, an interlayer film ($SiO_2$) 21 such as a TEOS film or a BPSG film is formed on the main surface of the semiconductor substrate 6 so as to cover the gate oxide film 19 and the gate electrode 13 (20) by a plasma CVD device, an atmospheric pressure CVD device, or the like. Thereafter, openings (contact holes) 23 penetrating to the p-type diffusion layers 18 are formed in an interlayer film 21 by photolithographic patterning and etching. At this time, the opening (contact hole) 23 is also formed on the gate electrode 13 (20).

Figure 7C:
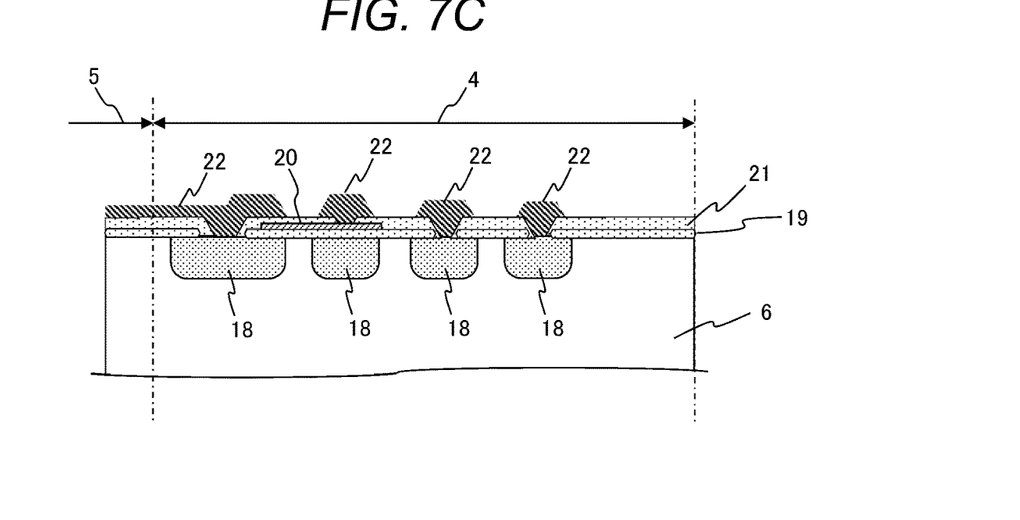
FIG. 7C is a cross-sectional view showing a manufacturing process following FIG. 7B.

Next, as shown in FIG. 7C, electrode films 22 made of, for example, Ti/TiN/Al, MoSi/Al, or the like are formed on the main surface of the semiconductor substrate 6 by the plasma CVD device, a sputtering device, or the like so as to cover the interlayer film 21 and fill the openings (contact holes) 23 formed in the interlayer film 21. Thereafter, the field plate electrodes (reference numeral 9 in FIG. 2) are formed by photolithographic patterning and etching.

Figure 7D:
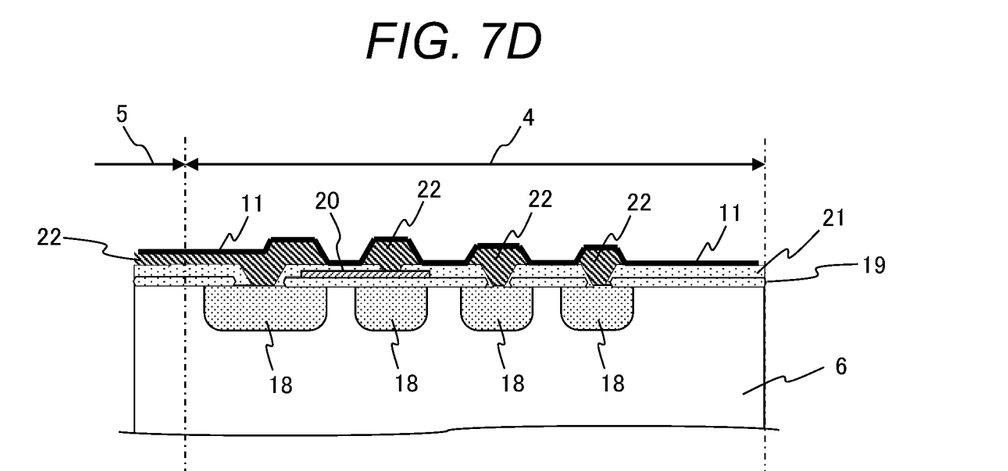
FIG. 7D is a cross-sectional view showing a manufacturing process following FIG. 7C.

Next, as shown in FIG. 7D, the insulating film 11 containing nitrogen such as a silicon nitride film ($Si_3N_4$) or a silicon oxynitride film (SiON) is formed on the main surface of the semiconductor substrate 6 by the plasma CVD device, a reactive sputtering device, or the like so as to cover the interlayer film 21 and the field plate electrodes 9 (22).

Figure 7E:
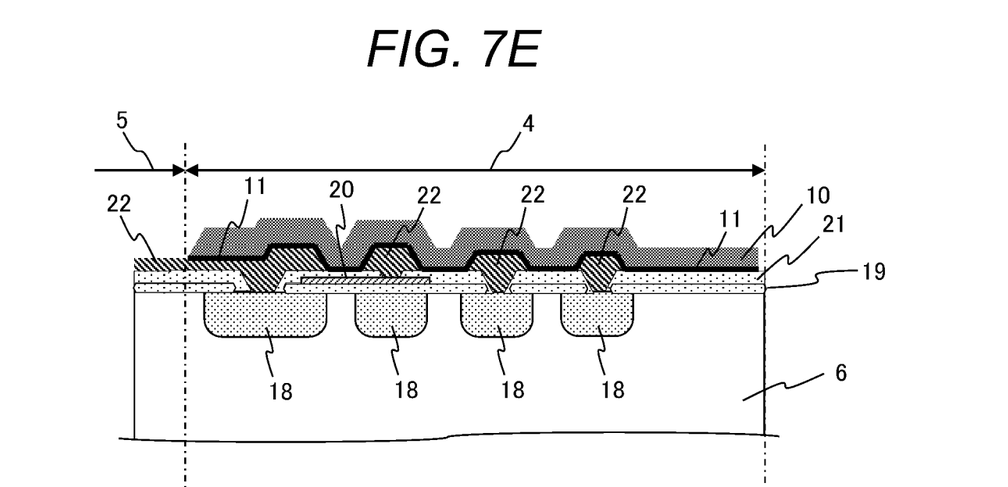
FIG. 7E is a cross-sectional view showing a manufacturing process following FIG. 7D.

Finally, as shown in FIG. 7E, an organic protective film (polyimide film) 10 is coated on the main surface of the semiconductor substrate 6 by a coating device so as to cover the insulating film 11 containing nitrogen. Thereafter, the organic protective film 10 and the insulating film 11 containing nitrogen on the pad electrode (reference numeral in FIG. 2) in the active region 5 are removed by photolithographic patterning and etching.

Through the manufacturing processes as described above, the termination structure shown in FIG. 2 is formed.

As described above, according to the semiconductor device of the present embodiment, in the termination region 4, the insulating film 11 containing nitrogen is provided between the interlayer insulating film 8 and the organic protective film 10, so that the penetration of moisture from the surface side of the IGBT chip 1 can be more reliably prevented and the high temperature and high humidity bias resistance can be improved.

In addition, the thickness of the insulating film 11 containing nitrogen is set to 100 nm or less (preferably 50 nm or less), so that the internal stress of the insulating film 11 containing nitrogen can be reduced as low as possible, and therefore, the influence on the device characteristics can be reduced.

Meanwhile, the thickness of the insulating film 11 containing nitrogen is set to 10 nm or more (preferably 20 nm or more), so that the penetration of moisture can be more reliably prevented and the process margin (tolerance for ensuring a certain film quality) when the insulating film 11 containing nitrogen is formed can be obtained.

In addition, the invention is particularly effective for a high breakdown voltage product in which the guard rings 7 and the field plate electrodes 9 are often provided in the termination region 4 as described above, but is not necessarily limited thereto. The invention can also be applied to a semiconductor chip adopting another termination structure that uses neither the guard ring 7 nor the field plate electrode 9, or a product having a relatively low breakdown voltage.

Second Embodiment

Figure 4:
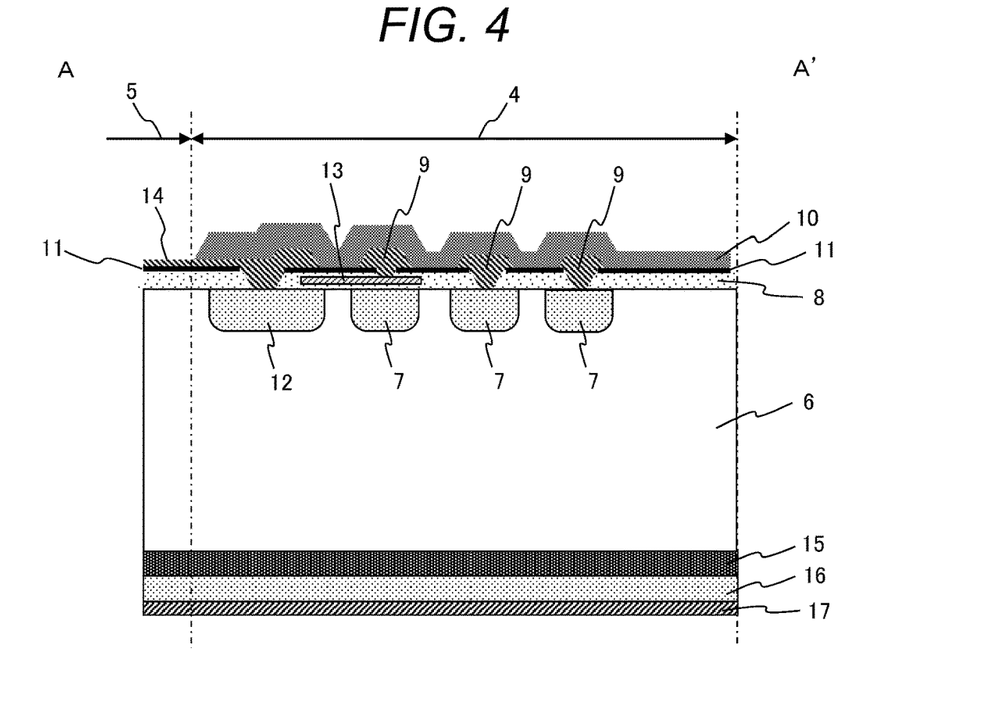
FIG. 4 is a partial cross-sectional view of an IGBT chip according to a second embodiment of the invention.
Figure 8A:
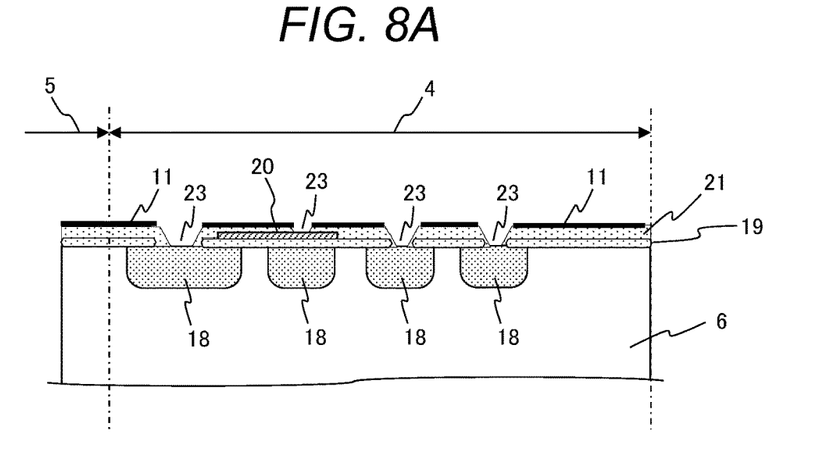
FIG. 8A is a cross-sectional view showing a manufacturing process of the IGBT chip according to the second embodiment of the invention.
Figure 8B:
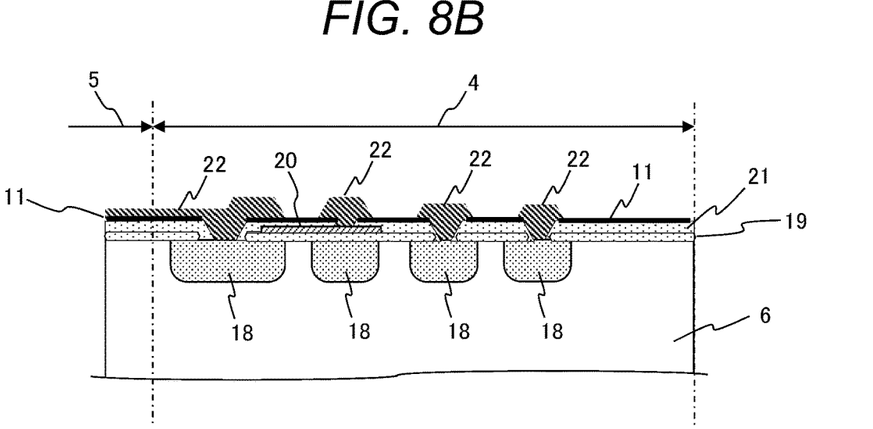
FIG. 8B is a cross-sectional view showing a manufacturing process following FIG. 8A.
Figure 8C:
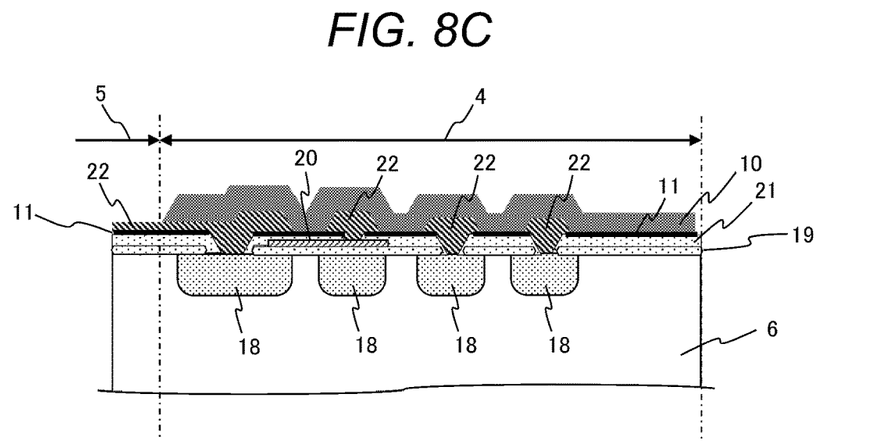
FIG. 8C is a cross-sectional view showing a manufacturing process following FIG. 8B.

A semiconductor device and a method of manufacturing the same according to the second embodiment of the invention will be described with reference to FIG. 4 and FIGS. 8A to 8C. FIG. 4 is a partial cross-sectional view of the semiconductor device of the present embodiment, which is a modification of the first embodiment (FIG. 2). FIGS. 8A to 8C are cross-sectional views showing main manufacturing processes in the method of manufacturing the semiconductor device of the present embodiment.

The present embodiment is different from the first embodiment in that in the first embodiment, as shown in FIGS. 7C and 7D, the insulating film 11 containing nitrogen is formed after the electrode films 22 are formed, whereas in the present embodiment, as shown in FIGS. 8A and 8B, the electrode films 22 are formed after the insulating film 11 containing nitrogen is formed.

By changing the order of formation of the electrode films 22 and the insulating film 11 containing nitrogen, as shown in FIG. 4, the insulating film 11 containing nitrogen is not provided on the upper surface of the field plate electrodes 9, but the insulating film 11 containing nitrogen is provided under the field plate electrodes 9, that is, between the interlayer insulating film 8 and the field plate electrodes 9.

With reference to FIGS. 8A to 8C, the method of manufacturing the semiconductor device according to the present embodiment described above will be described. In addition, since the step of forming the gate electrode 13 (20) is the same as that in FIG. 7A of the first embodiment, the description thereof will be omitted.

After the gate electrode 13 (20) is formed by the same method as in FIG. 7A, as shown in FIG. 8A, the interlayer film 21 such as a TEOS film and a BPSG film is formed on the main surface of the semiconductor substrate 6 by the plasma CVD device, the atmospheric pressure CVD device, or the like so as to cover the gate oxide film 19 and the gate electrode 13 (20). Thereafter, the insulating film 11 containing nitrogen such as a silicon nitride film ($Si_3N_4$) and a silicon oxynitride film (SiON) is formed on the main surface of the semiconductor substrate 6 by the plasma CVD device, the reactive sputtering device, or the like so as to cover the interlayer film 21. Subsequently, the openings (contact holes) 23 penetrating to the p-type diffusion layers 18 are formed in the insulating film 11 containing nitrogen and the interlayer film 21 by photolithographic patterning and etching. That is, the opening (contact holes) 23 is also formed in the gate electrode 13 (20).

Next, as shown in FIG. 8B, the electrode films 22 made of, for example, Ti/TiN/Al, MoSi/Al, or the like are formed on the main surface of the semiconductor substrate 6 by the plasma CVD device, the sputtering device, or the like so as to cover the insulating film 11 containing nitrogen and fill the openings (contact holes) 23 formed in the insulating film 11 containing nitrogen and the interlayer film 21. Thereafter, the field plate electrodes (reference numeral 9 in FIG. 4) are formed by photolithographic patterning and etching.

Finally, as shown in FIG. 8C, the organic protective film (polyimide film) 10 is coated on the main surface of the semiconductor substrate 6 by the coating device so as to cover the insulating film 11 containing nitrogen and the field plate electrodes (reference numeral 9 in FIG. 4). Thereafter, the organic protective film 10 on the pad electrode (reference numeral 14 in FIG. 4) in the active region 5 is removed by photolithographic patterning and etching.

In the present embodiment, the upper limit and the lower limit of the thickness of the insulating films 11 containing nitrogen are also defined in the same manner as in the first embodiment, thereby exerting the same effects as in the first embodiment.

Third Embodiment

Figure 5:
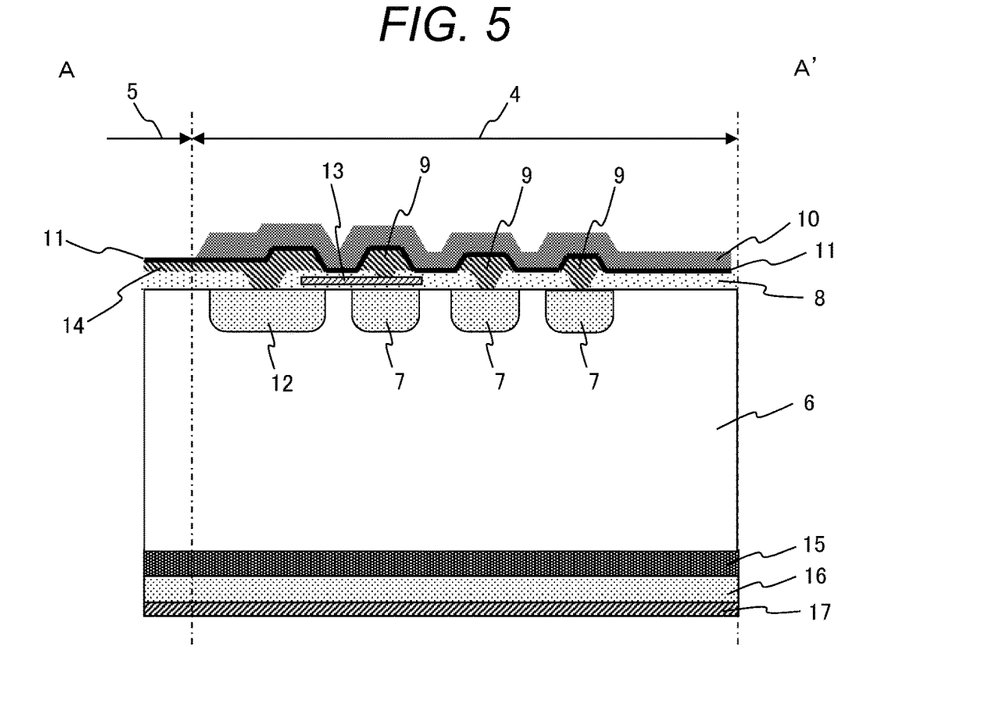
FIG. 5 is a partial cross-sectional view of an IGBT chip according to a third embodiment of the invention.

A semiconductor device according to the third embodiment of the invention will be described with reference to FIG. 5. FIG. 5 is a partial cross-sectional view of the semiconductor device according to the present embodiment, which is another modification of the first embodiment (FIG. 2).

The present embodiment is different from the first embodiment in that in the first embodiment, as shown in FIGS. 7D and 7E, the insulating film 11 containing nitrogen on the pad electrode (reference numeral 14 in FIG. 5) of the active region 5 is removed together with the organic protective film 10, whereas in the present embodiment, as shown in FIG. 5, the insulating film 11 containing nitrogen remains on the pad electrode without being etched when the organic protective film 10 on the pad electrode is removed by etching.

By remaining the insulating film 11 containing nitrogen on the pad electrode 14, a surface of the pad electrode 14 can be protected by the insulating film 11 containing nitrogen until a bonding wire is connected to the pad electrode 14 by wire bonding in mounting processes of the semiconductor device.

As described in the first embodiment, the thickness of the insulating film 11 containing nitrogen is as thin as 100 nm or less (preferably 50 nm or less). Therefore, the insulating film 11 containing nitrogen can be easily broken by wire bonding, and the bonding wire can be connected to the pad electrode 14. As a result, the insulating film 11 containing nitrogen remains on at least a part of the surface of the pad electrode 14.

In the present embodiment, the upper limit and the lower limit of the thickness of the insulating film 11 containing nitrogen are also defined in the same manner as in the first embodiment, thereby exerting the same effects as in the first embodiment. In addition, the surface of the pad electrode 14 is protected by the insulating film 11 containing nitrogen until wire bonding is performed, so that oxidation or corrosion of the surface of the pad electrode 14 can be prevented.

Fourth Embodiment

Figure 6:
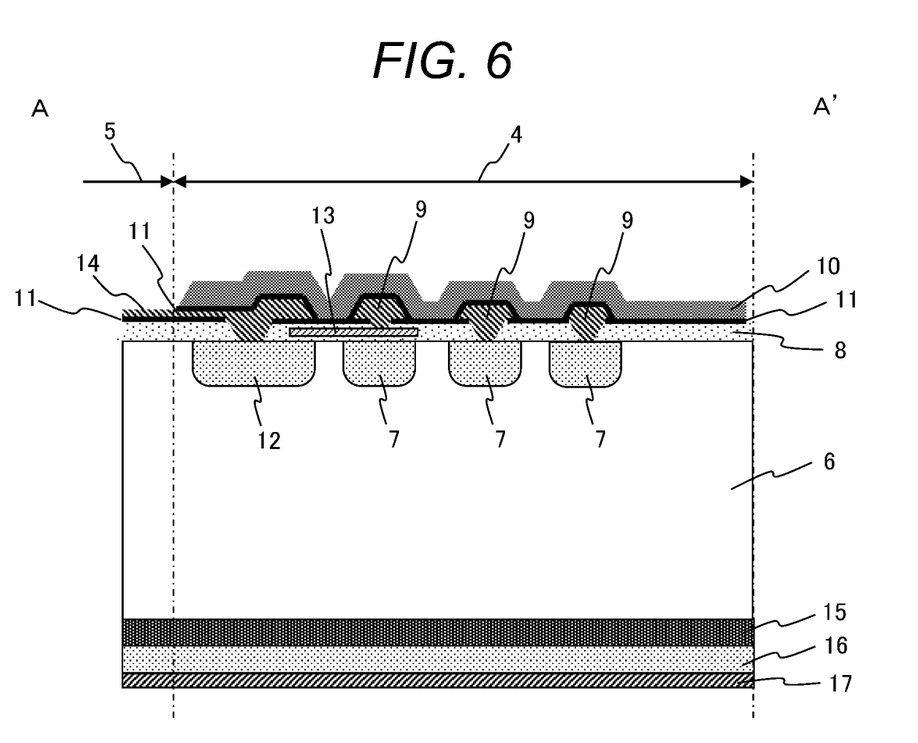
FIG. 6 is a partial cross-sectional view of an IGBT chip according to a fourth embodiment of the invention.

A semiconductor device according to the fourth embodiment of the invention will be described with reference to FIG. 6. FIG. 6 is a partial cross-sectional view of the semiconductor device according to the present embodiment, which is further another modification of the first embodiment (FIG. 2).

As shown in FIG. 6, the present embodiment is different from the first embodiment in that the semiconductor device according to the present embodiment is provided with insulating films 11 containing nitrogen on and under the field plate electrodes 9. That is, a composite structure of the first embodiment (FIG. 2) and the second embodiment (FIG. 4) is obtained.

The insulating films 11 containing nitrogen are provided between the interlayer insulating film 8 and the organic protective film 10 as well as between the field plate electrodes 9 and the organic protective film 10 so as to cover the interlayer insulating film 8 and the field plate electrodes 9, and also provided between the interlayer insulating film 8 and the field plate electrodes 9.

In addition, it is defined that the total thickness of the insulating films 11 containing nitrogen provided on and under the field plate electrodes 9 is the same as that of the first embodiment. That is, the upper limit of the total thickness of the insulating films 11 containing nitrogen on and under the field plate electrodes 9 is 100 nm or less (preferably 50 nm or less). In addition, the lower limit of the total thickness of the insulating films 11 containing nitrogen on and under the field plate electrodes 9 is 10 nm or more (preferably 20 nm or more).

According to the present embodiment, the insulating films 11 containing nitrogen are provided on and under the field plate electrodes 9, so that the influence on the device characteristics due to the internal stress of the insulating films 11 containing nitrogen can be reduced, the penetration of moisture from the surface side of the IGBT chip 1 can be reliably prevented, the possibility of corrosion of the field plate electrodes 9 due to moisture can be further reduced, and the high temperature and high humidity bias resistance can be improved, similarly to the first and second embodiments.

In addition, as a modification of FIG. 6, a composite structure of the second embodiment (FIG. 4) and the third embodiment (FIG. 5) may be adopted. That is, in addition to providing the insulating films 11 containing nitrogen on and under the field plate electrodes 9, the surface of the pad electrode 14 may be protected by the insulating films 11 containing nitrogen until wire bonding is performed as in the third embodiment (FIG. 5).

In addition, the invention is not limited to the above-described embodiments, and includes various modifications. For example, the above embodiments have been described in detail in order to facilitate understanding of the invention, and are not necessarily limited to those including all the configurations described above. In addition, a part of the configuration of a certain embodiment may be replaced with the configuration of another embodiment, and the configuration of a certain embodiment may be added with the configuration of another embodiment. In addition, a part of the configuration of the embodiments may be added, deleted, or replaced with another configuration.

What is claimed is:

1. A semiconductor device comprising:
   an active region disposed on a main surface of a semiconductor substrate; and
   a termination region disposed on the main surface so as to surround the active region, wherein
   the termination region includes an interlayer insulating film formed on the main surface of the semiconductor substrate, and an organic protective film formed so as to cover the interlayer insulating film,
   an insulating film having a thickness of 100 nm or less and containing nitrogen is provided between the interlayer insulating film and the organic protective film, and
   a gate electrode formed within the interlayer insulating film.

2. The semiconductor device according to claim 1, wherein the termination region includes a guard ring formed on the main surface of the semiconductor substrate.

3. The semiconductor device according to claim 2, wherein the termination region includes a field plate electrode formed on the interlayer insulating film and connected to the guard ring by penetrating through an opening formed in the interlayer insulating film.

4. The semiconductor device according to claim 3, wherein the organic protective film is formed so as to cover the interlayer insulating film and the field plate electrode.

5. The semiconductor device according to claim 1, wherein the insulating film containing nitrogen has a thickness of 50 nm or less.

6. The semiconductor device according to claim 1, wherein the insulating film containing nitrogen has a thickness of 10 nm or more.

7. The semiconductor device according to claim 1, wherein the insulating film containing nitrogen has a thickness of 20 nm or more.

8. The semiconductor device according to claim 4, wherein the insulating film containing nitrogen is provided between the organic protective film and the interlayer insulating film and the field plate electrode so as to cover the interlayer insulating film and the field plate electrode.

9. The semiconductor device according to claim 4, wherein the insulating film containing nitrogen is also provided between the interlayer insulating film and the field plate electrode.

10. The semiconductor device according to claim 4, wherein the insulating film containing nitrogen is not provided on an upper surface of the field plate electrode.

11. The semiconductor device according to claim 4, wherein the active region includes a pad electrode formed on the main surface of the semiconductor substrate, and the insulating film containing nitrogen is provided on at least a part of a surface of the pad electrode.

12. The semiconductor device according to claim 4, wherein the insulating film containing nitrogen is provided between the organic protective film and the interlayer insulating film and the field plate electrode so as to cover the interlayer insulating film and the field plate electrode.

13. The semiconductor device according to claim 1, wherein the insulating film containing nitrogen is a silicon nitride film or a silicon oxynitride film.

* * * * *